United States Patent
Lin et al.

(10) Patent No.: US 7,619,221 B2
(45) Date of Patent: Nov. 17, 2009

(54) INFRARED RECEIVING MODULE

(75) Inventors: Hui-Chin Lin, Houli Township, Taichung County (TW); Chun-Chih Liang, Taipei (TW)

(73) Assignee: Everlight Electronics Co., Ltd., Taipei Hsien (TW)

( * ) Notice: Subject to any disclaimer, the term of this patent is extended or adjusted under 35 U.S.C. 154(b) by 0 days.

(21) Appl. No.: 12/168,526

(22) Filed: Jul. 7, 2008

(65) Prior Publication Data

US 2009/0008557 A1 Jan. 8, 2009

(30) Foreign Application Priority Data

Jul. 5, 2007 (TW) ............................... 96210969 U

(51) Int. Cl.
*G01J 5/20* (2006.01)
(52) U.S. Cl. .................................................. 250/338.4
(58) Field of Classification Search ............... 250/338.4
See application file for complete search history.

(56) References Cited

U.S. PATENT DOCUMENTS

| | | | | |
|---|---|---|---|---|
| 4,180,726 | A * | 12/1979 | DeCrescent | 250/222.1 |
| 4,962,303 | A * | 10/1990 | Chu | 250/208.1 |
| 6,583,401 | B2 * | 6/2003 | Giebler et al. | 250/214.1 |
| 6,594,886 | B2 * | 7/2003 | Osaki et al. | 29/623 |
| 6,621,616 | B1 * | 9/2003 | Bauer et al. | 359/273 |
| 2002/0066592 | A1 * | 6/2002 | Cheng | 174/260 |
| 2002/0175285 | A1 * | 11/2002 | Ito et al. | 250/338.3 |
| 2005/0213926 | A1 * | 9/2005 | Tabei et al. | 385/147 |
| 2006/0157651 | A1 * | 7/2006 | Yamauchi et al. | 250/338.1 |

* cited by examiner

*Primary Examiner*—David P Porta
*Assistant Examiner*—Jessica L Eley
(74) *Attorney, Agent, or Firm*—Muncy, Geissler, Olds & Lowe, PLLC

(57) ABSTRACT

An infrared receiving module is disclosed. The infrared receiving module including a first strip element, a second strip element, an infrared receiver disposed on the second strip element, and a resin wrapping the first strip element and the second strip element. The first strip element has a receiving window. The infrared receiver on the second strip element is under the receiving window.

9 Claims, 1 Drawing Sheet

INFRARED RECEIVING MODULE

RELATED APPLICATIONS

This application claims priority to Taiwan Application Serial Number 96210969, filed Jul. 5, 2007, which is herein incorporated by reference.

BACKGROUND

1. Field of Invention

The present invention relates to an optical transceiver module. More particularly, the present invention relates to an infrared receiving module.

2. Description of Related Art

Computers have been widely applied and rapidly progressed in different fields and network technologies. Therefore, people can easily access information and provide service by way of networks. Due to the enormous data transmission capacity of photoelectric communication devices, photoelectric technology seems a likely candidate for improving transmission quality. Currently, the photoelectric industry combining the electronics industry and the optics industry is progressing well.

An optical transceiver module may include an optical transmitter and an optical receiver. The main function of optical receiver is to convert an optical signal to an electronic signal, of which the most critical component is a detector. The major principle of the detector is to generate enough energy by radiating light onto a photo diode to excite pairs of electrons and holes, thereby generating a current signal.

Infrared transceivers have been widely used in consumer electronic device control. The consumer electronic devices are becoming smaller and cost less. Thus, there is a need for reducing the size and the cost of the infrared transceiver.

SUMMARY

The invention provides an infrared receiving module including a first strip element, a second strip element, an infrared receiver disposed on the second strip element, and a resin wrapping the first strip element and the second strip element. The first strip element has a receiving window. The infrared receiver on the second strip element is under the receiving window.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
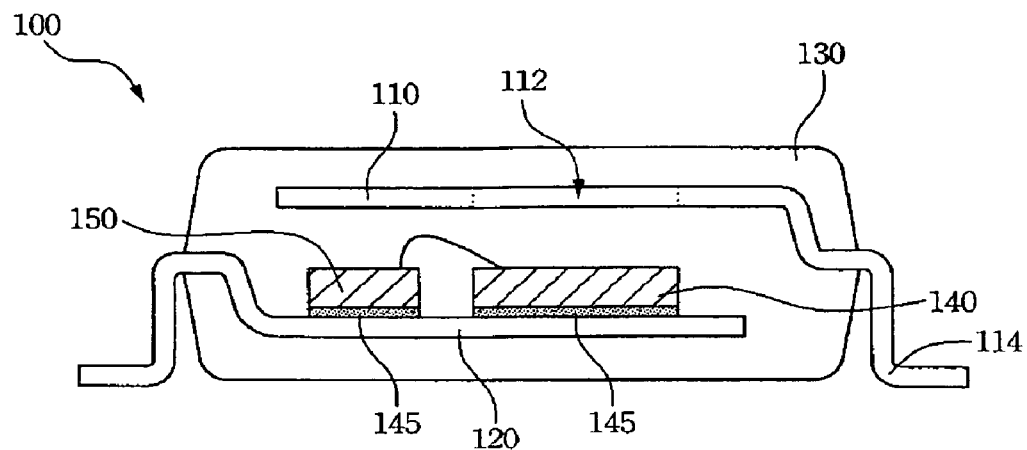
FIG. 1 is a side view diagram of an embodiment of the infrared receiving module of the invention.

Reference will now be made in detail to the present preferred embodiments of the invention, examples of which are illustrated in the accompanying drawings. Wherever possible, the same reference numbers are used in the drawings and the description to refer to the same or like parts.

Refer to FIG. 1. FIG. 1 illustrates a side view diagram of an embodiment of an infrared receiving module of the invention. The infrared receiving module 100 includes a first strip element 110, a second strip element 120, an infrared receiver 140 disposed on the second strip element 120, a driving chip 150 disposed on the second strip element 120, and a resin 130 for wrapping the first strip element 110 and the second strip element 120. The first strip element 110 has a receiving window 112. The infrared receiver 140 is disposed under the receiving window 112. An infrared light emitted from an infrared emitting module (not shown) may pass through the receiving window 112 and be received by the infrared receiver 140.

The material of the first strip element 110 and the second strip element 120 may be a metal, such as a copper (Cu) or an iron (Fe). The first strip element 110 with metal material may have a ground (GND) pin 114 partially wrapped in the resin 130. The first strip element 110 with metal material having the GND pin 114 may replace a traditional metal case and provide an electromagnetic shielding function to eliminate noise interference. The kinds and the structure of the elements are quite simple, that the second strip element 120 with metal material may replace a tradition printed circuit board (PCB), which haps a higher prime cost. The infrared receiver 140 and the driving chip 150 may be mounted on the second strip element 120 with a silver glue 145. The silver glue 145 is disposed between the infrared receiver 140 and the second strip element 120. The silver glue 145 is disposed between the driving chip 150 and the second strip element 120. The resin 130 may be an epoxy resin. The infrared receiver 140 may be a photodiode or a phototransistor.

Figure 2:
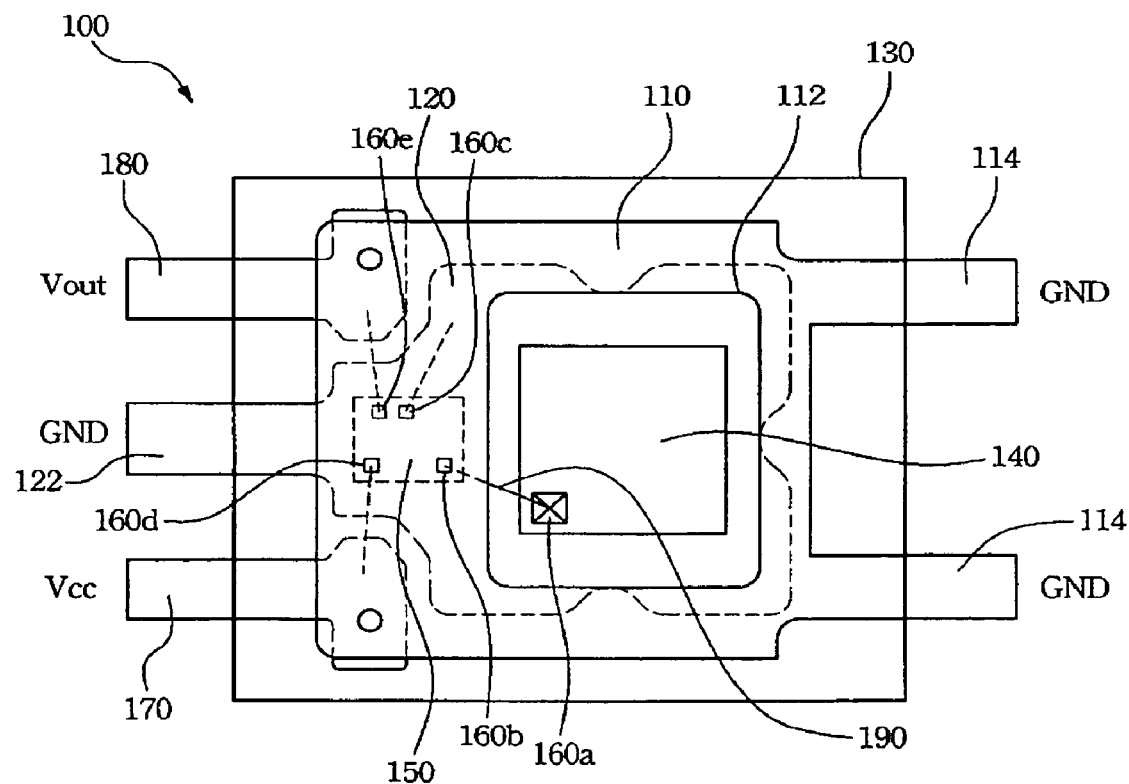
FIG. 2 is a top view diagram of another embodiment of the infrared receiving module of the invention.

Refer to FIG. 2. FIG. 2 illustrates a top view diagram of another embodiment of the infrared receiving module of the invention. The first strip element 110 may have two ground (GND) pins 114. The infrared light emitted from the infrared emitting module may pass through the receiving window 112 and be received by the infrared receiver 140 disposed on the second strip is element 120. The infrared receiver 140 and the driving chip 150 may have a plurality of bonding pads 160a, 160b, 160c, 160d, and 160e, which are arranged facing the first strip element 110. The infrared receiving module 100 may have a Vcc pin 170 and a Vout pin 180. The second strip element 120 may have the ground (GND) pin 122. The Vcc pin 170, the Vout pin 180, and the GND pin 122 may be partially wrapped in the resin 130.

The infrared receiving module 100 may include a plurality of bonding wires 190. The bonding pad 160a of the infrared receiver 140 may connect to the bonding pad 160b of the driving chip 150 with the bonding wire 190 for electrically connecting the infrared receiver 140 and the driving chip 150. The bonding pad 160c of the driving chip 150 for grounding may connect to the GND pin 122 of the second strip element 120 with the bonding wire 190. The bonding pad 160d and 160e of the driving chip 150 may connect to the Vcc pin 170 and the Vout pin 180 respectively with the bonding wires 190, and the Vcc pin 170 and the Vout pin 180 may further lead to an external voltage for driving the driving chip 150.

The first strip element with metal material of the infrared receiving module may provide an electromagnetic shielding function to eliminate noise interference. The infrared receiver and the driving chip may be mounted on the second strip element directly. The metal case and the PCB in the conventional infrared receiving module may be replaced with the upper metal frame and the lower metal frame in this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An infrared receiving module comprising:
   a first strip element, having a shielding portion and a ground pin, wherein a receiving window is formed in the shielding portion;
   a second strip element, having a load area and a ground pin, wherein the first strip element and the second strip element are physically disconnected;
   an infrared receiver exposed on the load area of the second strip element, wherein the infrared receiver is exposed by the receiving window; and
   a resin package encapsulating the shielding portion of the first strip element and the load area of the second strip element and exposing a portion of the ground pin of the first strip element and a portion of the ground pin of the second strip element.

2. The infrared receiving module of claim 1, wherein the material of the first strip element and the second strip element is a metal.

3. The infrared receiving module of claim 2, wherein the material of the first strip element and the second strip element is a copper or an iron.

4. The infrared receiving module of claim 1, wherein the infrared receiver is a photodiode or a phototransistor.

5. The infrared receiving module of claim 1, wherein the resin package is an epoxy resin.

6. The infrared receiving module of claim 1, further comprising a driving chip disposed on the load area of the second strip element, wherein the infrared receiver and the driving chip have a plurality of bonding pads facing the first strip element respectively.

7. The infrared receiving module of claim 6, further comprising a silver glue glued on the second strip element for securing the infrared receiver and the driving chip on the load area of the second strip element.

8. The infrared receiving module of claim 7, further comprising a Vout pin and a Vcc pin partially wrapped in the resin package, wherein the infrared receiving module further comprises a plurality of bonding wires for connecting the bonding pads to the Vout pin and the Vcc pin.

9. The infrared receiving module of claim 1, wherein a surface of the resin package disposed over the receiving window is substantially parallel to the shielding portion.

* * * * *